United States Patent
Klarenbeek et al.

(10) Patent No.: US 11,799,426 B2
(45) Date of Patent: Oct. 24, 2023

(54) CLASS D AMPLIFIER CIRCUITRY

(71) Applicant: Cirrus Logic International Semiconductor Ltd., Edinburgh (GB)

(72) Inventors: Johnny Klarenbeek, Austin, TX (US); David P. Singleton, Edinburgh (GB); Morgan T. Prior, Dunbar (GB); Jonathan T. Wigner, Edinburgh (GB); Christopher M. Dougherty, Austin, TX (US); Qi Cai, Austin, TX (US); Anindya Bhattacharya, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 0 days.

(21) Appl. No.: 17/537,619

(22) Filed: Nov. 30, 2021

(65) Prior Publication Data

US 2023/0170850 A1 Jun. 1, 2023

(51) Int. Cl.
*H03F 1/02* (2006.01)
*H03F 3/217* (2006.01)
*H03F 3/38* (2006.01)

(52) U.S. Cl.
CPC .......... *H03F 1/0233* (2013.01); *H03F 3/217* (2013.01); *H03F 2200/03* (2013.01); *H03F 2200/105* (2013.01)

(58) Field of Classification Search
CPC .... H03F 1/0233; H03F 3/217; H03F 2200/03; H03F 2200/105
USPC ........................................ 330/10, 251, 207 A
See application file for complete search history.

(56) References Cited

U.S. PATENT DOCUMENTS

| | | | |
|---|---|---|---|
| 7,262,658 B2* | 8/2007 | Ramaswamy | H03F 3/2173 330/10 |
| 7,492,219 B1 | 2/2009 | Cyrusian | |
| 7,679,435 B2* | 3/2010 | Tsuji | H03F 3/2175 330/10 |
| 2007/0024361 A1 | 2/2007 | Krishnan et al. | |
| 2007/0024365 A1 | 2/2007 | Ramaswamy et al. | |

FOREIGN PATENT DOCUMENTS

| | | |
|---|---|---|
| GB | 2496664 A | 5/2013 |
| KR | 1020110083874 A | 7/2011 |

OTHER PUBLICATIONS

Combined Search and Examination Report under Sections 17 and 18(3), UKIPO, Application No. GB2215441.3, dated Apr. 20, 2023.

(Continued)

*Primary Examiner* — Hieu P Nguyen
(74) *Attorney, Agent, or Firm* — Jackson Walker L.L.P

(57) ABSTRACT

Class D amplifier circuitry comprising: input buffer circuitry configured to receive a first digital input signal modulated according to a first modulation scheme in which the digital input signal can take a first plurality N of discrete signal levels; analog modulator circuitry configured to generate an analog modulated signal based on an analog output signal output by the input buffer circuitry; and quantizer circuitry configured to generate an output signal based on the analog modulated signal, wherein the output signal is modulated according to a second modulation scheme in which the output signal can take a second plurality M of discrete signal levels, wherein the second plurality M is greater than the first plurality N.

18 Claims, 6 Drawing Sheets

(56) References Cited

OTHER PUBLICATIONS

Chen, et al., A filterless digital audio class-D amplifier based on grow-left double-edge pulse width modulation, Figures 1-3 and Sections II & III, 2nd IEEE International Conference on Integrated Circuits and Microsystems, pp. 231-235, published 2017.

\* cited by examiner

CLASS D AMPLIFIER CIRCUITRY

FIELD OF THE INVENTION

The present disclosure relates to Class D amplifier circuitry.

BACKGROUND

Class D amplifiers are increasingly being used in electronic devices for which power efficiency is important, such as mobile telephones, portable media players, laptop and tablet computers and wireless headphones, earphones and earbuds.

Although Class D amplifiers are highly efficient, there is a continuing demand, particularly in small form factor devices with limited battery capacity, to further improve power efficiency in order to increase battery life.

SUMMARY

According to a first aspect, the invention provides Class D amplifier circuitry comprising:
  input buffer circuitry configured to receive a first digital input signal modulated according to a first modulation scheme in which the digital input signal can take a first plurality N of discrete signal levels;
  analog modulator circuitry configured to generate an analog modulated signal based on an analog output signal output by the input buffer circuitry; and
  quantizer circuitry configured to generate an output signal based on the analog modulated signal, wherein the output signal is modulated according to a second modulation scheme in which the output signal can take a second plurality M of discrete signal levels,
  wherein the second plurality M is greater than the first plurality N.

The Class D amplifier circuitry may further comprise digital signal generator circuitry configured to generate the first digital input signal.

The Class D amplifier circuitry may further comprise digital modulator circuitry configured to generate a modulated digital signal based on a digital input signal.

The digital signal generator circuitry may be configured to selectively generate the first digital input signal according to the first modulation scheme or a second digital input signal according to the second modulation scheme.

The Class D amplifier circuitry may further comprise:
  digital modulator circuitry configured to generate a modulated digital signal based on a digital input signal; and
  envelope detector circuitry configured to output a signal indicative of a signal level of the digital input signal,
  wherein the digital signal generator circuitry is configured to generate the first digital input signal according to the first modulation scheme or the second digital input signal according to the second modulation scheme based on the signal level of the digital input signal.

The digital signal generator may be configured to generate the first digital input signal according to the first modulation scheme if the input signal level meets or exceeds a threshold, and to generate the second digital input signal according to the second modulation scheme if the input signal level is below the threshold.

The input buffer circuitry may comprise first and second reference voltage sources and a switch network operable to selectively couple the first or second reference voltage source to an output node of the input buffer circuitry based on a control signal indicative of a signal level of the first digital input signal.

The input buffer circuitry may comprise first, second and third reference voltage sources and a switch network operable to selectively couple the first, second or third reference voltage source to an output node of the input buffer circuitry based on a control signal indicative of a signal level of the second digital input signal generated.

The first plurality N may be equal to 2.

The second plurality M may be equal to 3.

The analog input signal may comprise an audio signal.

The digital input signal, the analog modulated signal and the output signal may each comprise a differential signal pair.

The digital input signal may comprises pulse width modulated (PWM) digital signal.

The analog modulated signal may comprise a pulse width modulated (PWM) analog signal.

According to a second aspect, the invention provides a host device comprising Class D amplifier circuitry according to the first aspect.

The host device may comprise a laptop, notebook, netbook or tablet computer, a mobile telephone, a portable device, or an accessory device for use with a laptop, notebook, netbook or tablet computer, a mobile telephone, or a portable device.

According to a third aspect, the invention provides Class D amplifier circuitry comprising:
  an input buffer for receiving a digital PWM input signal and outputting an analog output signal based on the digital PWM input signal;
  an analog modulator for generating an amplified PWM signal based on the digital PWM input signal; and
  an analog quantizer for generating a multi-level PWM output signal for driving a transducer based on the amplified PWM signal,
  wherein the multi-level output signal has a greater number of discrete signal levels than the digital PWM input signal.

According to a fourth aspect, the invention provides Class D amplifier circuitry comprising:
  an input buffer for receiving a digital PWM input signal and outputting an analog output signal based on the digital PWM input signal;
  an analog modulator for generating an amplified PWM signal based on the digital PWM input signal; and
  an analog quantizer for generating a multi-level PWM output signal for driving a transducer based on the amplified PWM signal,
  wherein a number of discrete signal levels in the digital PWM input signal is variable based on a level of an input signal received by the Class D amplifier circuitry, and wherein the number of discrete signal levels in the digital PWM input signal is equal to or less than a number of discrete signal levels in the multi-level PWM output signal.

BRIEF DESCRIPTION OF THE DRAWINGS

Embodiments of the invention will now be described, strictly by way of example only, with reference to the accompanying drawings, of which.

DETAILED DESCRIPTION

The present disclosure relates to Class D amplifier circuitry in which quiescent power consumption (i.e. power consumed when no output is being provided by a transducer driven by the Class D amplifier circuitry) can be reduced, through the use of modulation schemes that minimise or reduce voltages that develop across resistors associated with feedback paths of the Class D amplifier circuitry when no output is being provided by the transducer.

Figure 1:
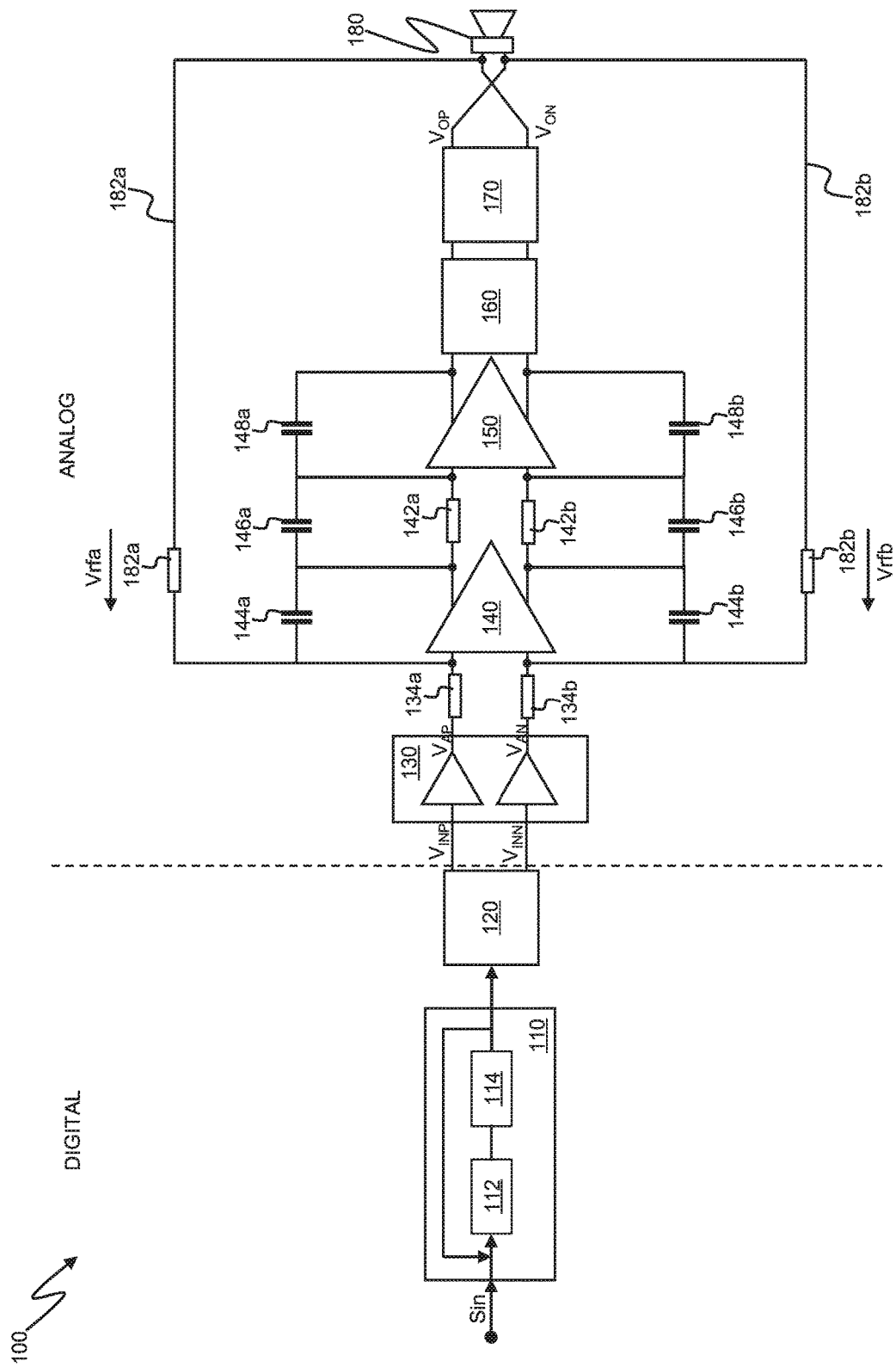
FIG. 1 is a schematic representation of example Class D audio amplifier circuitry.

FIG. 1 is a schematic representation of example Class D audio amplifier circuitry, which in this example implements a second order amplifier that uses a two-level pulse width modulation (PWM) scheme.

The Class D amplifier circuitry, shown generally at 100 in FIG. 1, includes digital PWM (pulse width modulation) modulator circuitry 110 comprising integrator circuitry 112 and quantizer circuitry 114. The digital PWM modulator circuitry 110 is configured to receive a digital audio input signal Sin (which may be, for example, a digital pulse code modulated (PCM) signal) and to output a PWM modulated digital output signal to digital PWM generator circuitry 120.

The digital PWM generator circuitry 120 is configured to receive the PWM modulated digital output signal from the digital PWM modulator circuitry 110 and to output modulated first and second digital PWM signals $V_{INP}$, $V_{INN}$ (which form a differential signal pair) to analog input buffer circuitry 130. The digital PWM signals $V_{INP}$, $V_{INN}$ are modulated in accordance with a two-level "BD" modulation scheme (referred to herein as "BD2"). As will be appreciated by those of ordinary skill in the art, under such a two-level "BD" modulation scheme, each digital PWM signal $V_{INP}$, $V_{INN}$ can take one of two different discrete signal levels (high or low) in any period of the PWM output signal, and the digital PWM signals $V_{INP}$, $V_{INN}$ are in phase with one another (in contrast to a two-level "AD" modulation scheme in which one of the digital PWM signals $V_{INP}$, $V_{INN}$ is phase-shifted with respect to the other).

The analog input buffer circuitry 130 has first and second inputs which each receive a respective one of the first and second digital PWM signals $V_{INP}$, $V_{INN}$. The analog input buffer circuitry 130 is configured to generate and output first and second analog output signals $V_{AP}$, $V_{AN}$ based on the received first and second digital PWM signals $V_{INP}$, $V_{INN}$, in which the voltage of each analog output signal $V_{AP}$, $V_{AN}$ reflects the signal level of the corresponding received digital PWM signal $V_{INP}$, $V_{INN}$.

Thus, the analog input buffer circuitry 130 effectively converts the received digital PWM signals $V_{INP}$, $V_{INN}$ into corresponding analog output signals $V_{AP}$, $V_{AN}$, such that when the first digital PWM signal $V_{INP}$ is at a low signal level, the first analog output signal $V_{AP}$ generated and output by the analog input buffer circuitry 130 is at a low analog voltage level, e.g. 0 v. When the first digital PWM signal $V_{INP}$ is at a high signal level, the first analog output signal $V_{AP}$ is at a high analog voltage level, which may be equal to a positive supply voltage +VDD (e.g. +1.8 v) of the circuitry 100, for example. Similarly, when the second digital PWM signal $V_{INN}$ is at a low signal level, the second analog output signal $V_{AN}$ generated and output by the analog input buffer circuitry 130 is at the low analog voltage level, e.g. 0 v. When the second digital PWM signal $V_{INN}$ is at a high signal level, the second analog output signal $V_{AN}$ is at the high analog voltage level, e.g. +VDD.

Outputs of the analog input buffer circuitry 130 are coupled, via respective first and second resistors 134a, 134b, to respective first and second inputs of first differential amplifier circuitry 140.

First and second differential outputs of the first differential amplifier circuitry 140 are coupled, via respective third and fourth resistors 142a, 142b, to respective first and second inputs of second differential amplifier circuitry 150.

A first integrator feedback path comprising a first capacitor 144a couples the first differential output of the first differential amplifier circuitry 140 to the first input of the first differential amplifier circuitry 140. Similarly, a second integrator feedback path comprising a second capacitor 144b couples the second differential output of the first differential amplifier circuitry 140 to the second input of the first differential amplifier circuitry 140.

A first feedforward path comprising a parallel combination of a third capacitor 146a and the first resistor 142a couples the first output of the first differential amplifier circuitry 140 to the first input of the second differential amplifier circuitry 150. Similarly, a second feedforward path comprising a parallel combination of a fourth capacitor 146b and the second resistor 142b couples the second output of the first differential amplifier circuitry 140 to the second input of the second differential amplifier circuitry 150.

A third integrator feedback path comprising a fifth capacitor 148a couples the second output of the second differential amplifier circuitry 150 to the second input of the second differential amplifier circuitry 150. Similarly, a fourth integrator feedback path comprising a sixth capacitor 148b couples the second output of the second differential amplifier circuitry 150.

The first and second differential outputs of the second differential amplifier circuitry 150 are coupled to respective first and second inputs of analog quantizer circuitry 160, which is configured to receive a differential signal pair output by the second differential amplifier circuitry 150 and to generate a BD2 modulated output signal pair comprising first and second two-level PWM output signals.

Because both the digital PWM generator circuitry 120 and the analog quantizer circuitry 160 are configured to output BD2 modulated PWM signal pairs, the circuitry 100 may be referred to as a BD2-BD2 arrangement or BD2-BD2 circuitry.

First and second differential outputs of the analog quantizer circuitry 160 are coupled to respective first and second inputs of H-bridge driver circuitry 170. The H-bridge driver circuitry 170 receives the output signal pair output by the analog quantizer circuitry 160, and generates first and second driver output signals $V_{OP}$, $V_{ON}$ for driving a transducer 180 (e.g. a speaker) whose inputs are coupled to first and second outputs of the H-bridge driver circuitry 170.

A first output signal feedback path 182a comprising a first feedback resistor 184a couples the second output of the H-bridge driver circuitry 170 to the first input of the first differential amplifier circuitry 140, such that the second driver output signal $V_{ON}$ is fed back to the first input of the first differential amplifier circuitry 140.

Similarly, a second output signal feedback path 182b comprising a second feedback resistor 184b (of equal resistance to the first feedback resistor 184a) couples the first output of the H-bridge driver circuitry 170 to the second input of the first differential amplifier circuitry 140, such that the first driver output signal $V_{OP}$ is fed back to the second input of the first differential amplifier circuitry 140.

As discussed above, the digital PWM generator circuitry 120 is configured to generate a differential pair of modulated output signals $V_{INP}$, $V_{INN}$ in accordance with a BD2 modulation scheme, such that in each period of the output digital PWM signal the first and second PWM output signals $V_{INP}$, $V_{INN}$ output by the digital PWM generator circuitry 120 can each take either a high signal level or a low signal level. The corresponding analog output signals $V_{AP}$, $V_{AN}$ output by the analog input buffer circuitry 130 can therefore each also take either a high signal level (e.g. a voltage equal to a positive supply voltage VDD, which may be 1.8 v, for example) or a low signal level (e.g. ground or 0 v). Thus, a differential input voltage of 0 v to the first differential amplifier circuitry 140 can arise either when the first and second PWM output signals $V_{INP}$, $V_{INN}$ output by the digital PWM generator circuitry 120 are both high, or when the first and second PWM output signals $V_{INP}$, $V_{INN}$ output by the digital PWM generator circuitry 120 are both low.

Similarly, the analog quantizer circuitry 160 is configured to output a differential pair of output signals in accordance with a BD2 modulation scheme, such that in each period of the output PWM signal the first and second driver output signals $V_{OP}$, $V_{ON}$ output by the H-bridge driver circuitry 170 can each take either a high signal level (e.g. +VDD) or a low signal level (e.g. 0 v).

Because the transducer 180 receives the first and second output signals $V_{OP}$, $V_{ON}$ from the H-bridge driver circuitry 170, the magnitude of the voltage across the transducer 180 is equal to $V_{OP}-V_{ON}$, and can thus take one of three different values: +VDD (if $V_{OP}$=+VDD and $V_{ON}$=0 v); −VDD (if $V_{OP}$=0 v and $V_{ON}$=+VDD); or 0 v (if $V_{OP}$=0 and $V_{ON}$=0 v or if $V_{OP}$=+VDD and $V_{ON}$=+VDD).

Thus, in order to provide zero input to the transducer 180 (i.e. a differential voltage of 0 v across the transducer 180), the H-bridge driver circuitry 170 must either output first and second driver output signals $V_{ON}$, $V_{OP}$ which both have a high magnitude (e.g. +VDD), or output first and second differential output signals of zero magnitude (e.g. 0 v).

Figure 2:
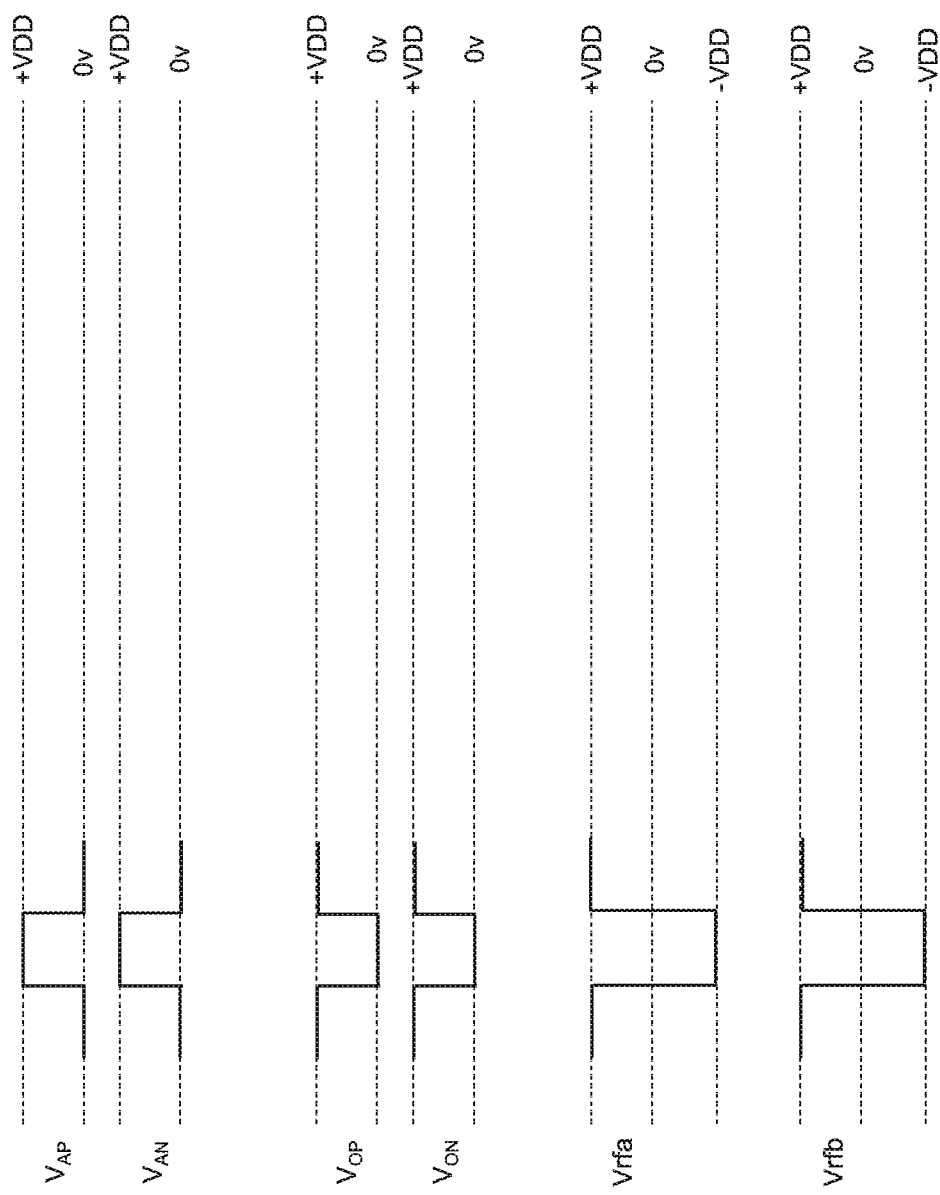
FIG. 2 illustrates voltages in the circuitry of FIG. 1 at zero transducer input states.

As illustrated in FIG. 2, if the analog output signals $V_{AP}$, $V_{AN}$ output by the analog input buffer circuitry 130 are both at 0 v (to produce a differential input voltage of 0 v to the first differential amplifier circuitry 140) and the driver output signals $V_{ON}$, $V_{OP}$ are both at a high signal level (e.g. +VDD), then because the second output of the H-bridge driver circuitry 170 is coupled, via the first feedback resistor 184a, to the first input of the first differential amplifier circuitry 140, to which the first output of the analog input buffer circuitry 130 is also coupled, a voltage Vrfa equal to +VDD (=VDD−0 v) develops across the series combination of the first feedback resistor 184a and the first resistor 134a.

Similarly, because the first output of the H-bridge driver circuitry 170 is coupled, via the second feedback resistor 184b, to the second input of the first differential amplifier circuitry 140 (which is also coupled to the second output of the analog input buffer circuitry 130), a voltage Vrfb equal to +VDD (=VDD−0 v) develops across the series combination of the second feedback resistor 184b and the second resistor 134b if the analog output signals $V_{AP}$, $V_{AN}$ output by the analog input buffer circuitry 130 are both at 0 v and the driver output signals $V_{ON}$, $V_{OP}$ are both at a high signal level (e.g. +VDD).

If the signals $V_{AP}$, $V_{AN}$ at the first and second inputs of the first differential amplifier circuitry 140 are both at a high signal level (e.g. +VDD), and the driver output signals $V_{ON}$, $V_{OP}$ both have a low magnitude (e.g. 0 v), then a voltage Vrfa equal to −VDD (=0 v−VDD) develops across the series combination of the first feedback resistor 184a and the first resistor 134a, and a voltage Vrfb equal to −VDD (=0 v−VDD) develops across the series combination of the second feedback resistor 184b and the second resistor 134b. Thus in the BD2-BD2 Class D amplifier circuitry 100 of FIG. 1, for certain combinations of $V_{OP}$ and $V_{AP}$ and $V_{ON}$ and $V_{AN}$ that give rise to a zero input signal to the transducer 180, a voltage of magnitude VDD develops across the series combination of the first feedback resistor 184a and the first resistor 134a and across the series combination of the second feedback resistor 184b and the second resistor 134b. This can be a cause of relatively significant quiescent power consumption in the amplifier circuitry 100.

This quiescent power consumption associated with each series combination of resistors (184a and 134a, 184b and 134b) can be calculated as $$\frac{VDD^2}{(Rf + Ri)},$$

where Rf is the resistance of each of the first and second feedback resistors 184a, 184b (which are assumed to be of equal resistance) and Ri is the resistance of the first and second resistors 134a, 134b (which are assumed to be of equal resistance).

As will be appreciated, in a low-noise design Rf and Ri will be small (e.g. of the order of 1 kΩ each), and so the quiescent power consumption will be relatively large (the smaller Rf and Ri the larger the power consumption for a given VDD).

For example, if VDD=1.8 v and Rf and Ri are each 1 kΩ, then the quiescent power consumption associated with the series combination of the first feedback resistor 184a and the first resistor 134a will be 1.62 mW. The quiescent power consumption associated with the series combination of the second feedback resistor 184b and the second resistor 134b will also be 1.62 mW.

In some cases the quiescent power consumption associated with the series combination of the first feedback resistor 184a and the first resistor 134a can be the dominant source of quiescent power consumption in the amplifier circuitry 100. Thus it is desirable to reduce this quiescent power consumption.

One possible approach to reducing the quiescent power consumption of the circuitry 100 when a zero input signal is supplied to the transducer 180 is to use an alternative modulation scheme for both the digital PWM generation performed by the digital PWM generator circuitry 120 and the analog quantizer circuitry 160, such that the output signals $V_{INP}$, $V_{INN}$ output by the digital PWM generator circuitry 120 and the analog output signals $V_{AP}$, $V_{AN}$ output by the analog quantizer circuitry 160 can each take more than two possible discrete signal levels. Such modulation schemes may be referred to as "multi-level" modulation schemes.

For example, if both the digital PWM generator circuitry 120 and the analog quantizer circuitry 160 implement a three-level BD (or "BD3") modulation scheme (which may be referred to as a BD3-BD3 arrangement), each output signal of the differential signal pair $V_{INP}$, $V_{INN}$ output by the digital PWM generator circuitry 120 can take one of three different discrete signal levels: high, low, or intermediate, in a given PWM signal period. Similarly, each output signal output by the analog quantizer circuitry 160 (and thus also each of the driver output signals $V_{OP}$, $V_{ON}$ output by the H-bridge driver circuitry 170) can take one of three different discrete signal levels: high (e.g. +VDD), low (e.g. 0 v), or intermediate (e.g. +VDD/2), in a given PWM signal period. Thus, the magnitude of the differential output across the output device (e.g. transducer 180) can take one of five different levels (e.g. +VDD, +VDD/2, 0 v, −VDD/2, −VDD).

As will be appreciated, a zero transducer input (i.e. a 0 v differential output signal level) is achieved when the driver output signals $V_{OP}$, $V_{ON}$ are equal, e.g. when $V_{OP}$ and $V_{ON}$ are both equal to VDD, VDD/2 or 0V.

In a "natural" zero transducer input state of a BD3-BD3 arrangement, $V_{OP}$ and $V_{ON}$ are both VDD/2 (such that the differential voltage across the transducer is 0 v, thus producing no transducer output), and $V_{AP}$ and $V_{AN}$ are also VDD/2. Thus, the differential input and output voltages to the BD3-BD3 system are zero, and because $V_{OP}$ is equal to $V_{AP}$ and $V_{ON}$ is equal to $V_{AN}$, no voltage develops across either the series combination of the first feedback resistor 184a and the first resistor 134a, or the series combination of the second feedback resistor 184b and the second resistor 134b (i.e. Vrfa and Vrfb are both equal to 0), and thus no power can be consumed by the resistors 184a, 184b, 134a, 134b in the "natural" zero transducer input state.

Accordingly, by controlling the voltages at the outputs of the analog input buffer circuitry 130 and the H-bridge driver circuitry 170 and the analog input buffer circuitry 130 such that in the zero transducer input state $V_{OP}$ and $V_{ON}$ are both VDD/2 and $V_{AP}$ and $V_{AN}$ are also both VDD/2, quiescent power consumption associated with the resistors 184a, 184b, 134a, 134b for the zero transducer input can be eliminated (or at least minimised or substantially reduced).

In order to implement a scheme of the kind described above, in which the analog output signals $V_{AP}$, $V_{AN}$ and the driver output signals $V_{OP}$, $V_{ON}$ output to the transducer 180 are modulated according to a multi-level (e.g. BD3) modulation scheme, the analog input buffer circuitry 130 and the analog quantizer circuitry 160 of the circuitry 100 must have access to a reference voltage for each different discrete signal level of the multi-level modulation scheme. For example, in order to implement a BD3 scheme, the analog input buffer circuitry 130 and the analog quantizer circuitry 160 must each have access to three reference voltages, typically a high voltage (e.g. a positive supply voltage +VDD, which may be, for example, 1.8 v), a low voltage (e.g. ground or 0 v) and an intermediate voltage at a level between the low voltage and the high voltage (e.g. VDD/2, which may be equal to 0.9 v).

Figure 3:
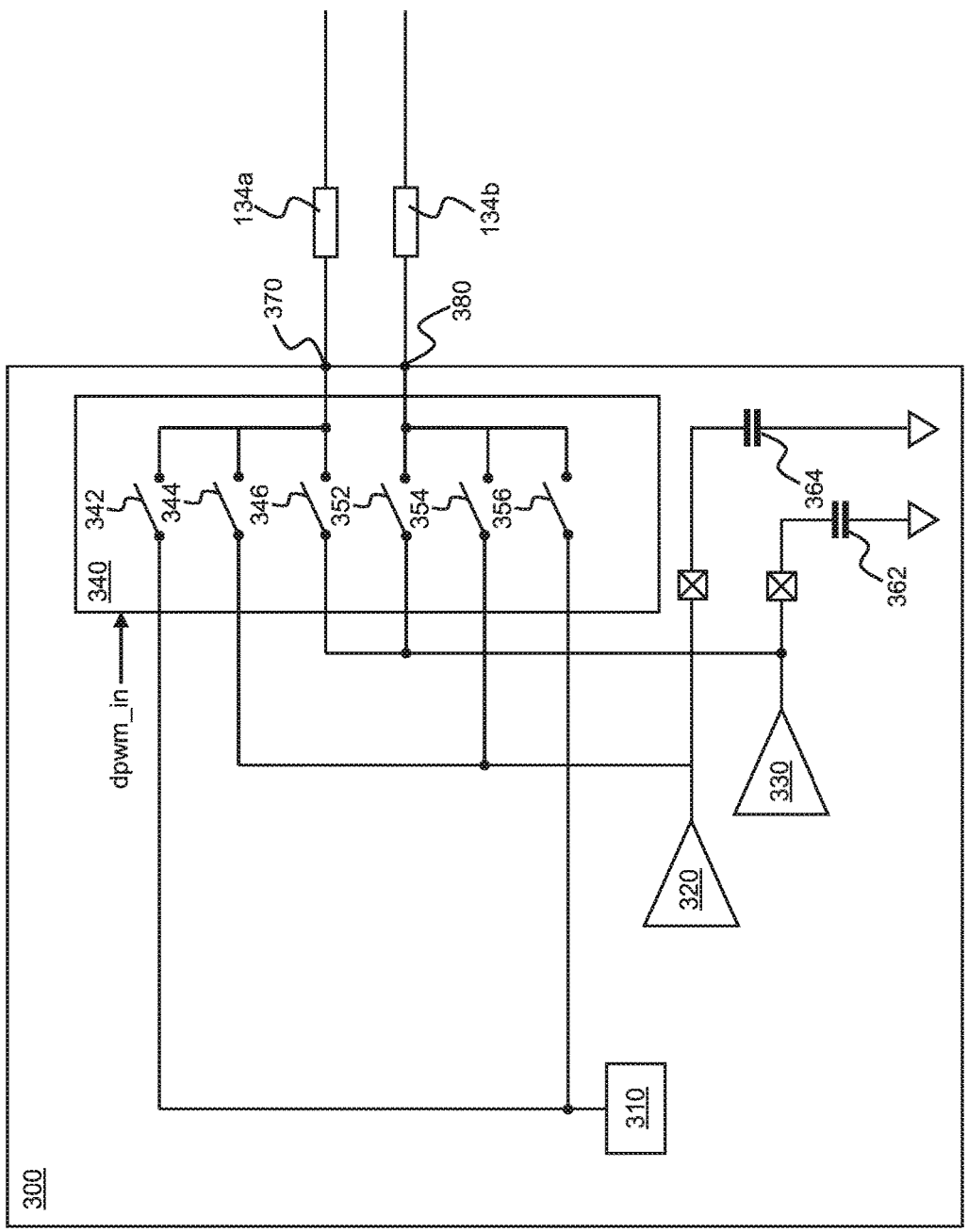
FIG. 3 is a schematic representation of analog input buffer circuitry for a BD3-BD3 implementation of the circuitry of FIG. 1.

FIG. 3 is a schematic representation of an example implementation of analog input buffer circuitry for use in an implementation of the Class D amplifier circuitry 100 in which the digital PWM generator circuitry 120 uses a BD3 modulation scheme.

The analog input buffer circuitry, shown at 300 in FIG. 3, comprises, in this example, a first reference voltage source 310, which supplies a first, low voltage, reference (e.g. 0 v), a second reference voltage source 320, which supplies a second, intermediate voltage, reference (e.g. VDD/2, which may be 0.9 v, for example), and a third, high voltage, reference (e.g. VDD, which may be 1.8 v, for example).

Outputs of the first, second and third reference voltage sources 310-330 are coupled to a switch network 340. The output of the second reference voltage source 320 is also coupled to a first terminal of a first capacitor 362, whose second terminal is coupled to ground, and the output of the third reference voltage source 330 is also coupled to a first terminal of a second capacitor 364, whose second terminal is coupled to ground. The first and second capacitors 362, 364 may each have a capacitance of the order of 1 μF, for example. Where the amplifier circuitry 100 or the analog input buffer circuitry 300 is implemented as an integrated circuit (chip), the first and second capacitors 362, 364 may be provided externally of the integrated circuit (i.e. off-chip) and coupled to the reference voltage sources via IC contact such as pads, balls, pins or the like.

The switch network 340 includes first to third high-side switches 342-346 and first to third low-side switches 352-356. The high side switches 342-346 are operable to selectively couple one of the first, second or third reference voltage sources 310-330 to a first output node 370 of the analog input buffer circuitry 300, which is coupled to the first resistor 134a. Similarly, the low-side switches 352-356 are operable to selectively couple one of the first, second or third reference voltage sources 310-330 to a second output node 380 of the analog input buffer circuitry 300, which is coupled to the second resistor 134b. The switch network 340 receives a control signal dpwm_in, which is indicative of the signal levels of the modulated PWM output signals $V_{INP}$, $V_{INN}$, and controls the switches 342-346, 352-356 to generate a desired differential output signal pair for input to the first differential amplifier circuitry 140.

Because the analog input buffer circuitry 130 is open loop (and thus there is no feedback to compensate for errors in the reference voltages 320, 330), there is a requirement for the second and third voltage reference sources 320, 330 to have a high level of immunity or resistance to sources of non-linearity.

Sources of non-linearity can include edge transition errors, for example, which can occur when the first and second analog output signals $V_{AP}$, $V_{AN}$ of the analog input buffer circuitry 130 are not precisely synchronised in time, such that edges of transitions between discrete signal levels in the first analog output signal $V_{AP}$ do not align in time with the edges of corresponding transitions between discrete signal levels in the second analog output signal $V_{AN}$.

For example, a zero input signal at the transducer 180 can be generated when both of the analog output signals $V_{AP}$, $V_{AN}$ of the analog input buffer circuitry 130 are at the same signal level. However, if a transition between, e.g., the intermediate signal level and the high signal level in the first output signal $V_{AP}$ of the analog input buffer circuitry 130 is not synchronised or aligned in time with a corresponding transition between the intermediate and high signal levels in the second output signal $V_{AN}$ of the analog input buffer circuitry 130, then there will be an error period for which the two output signals $V_{AP}$, $V_{AN}$ are at different levels (e.g. the first analog output signal $V_{AP}$ may be at the high signal level and the second analog output signal $V_{AN}$ may be at the intermediate signal level during the error period), which will lead to a non-zero input to the transducer 180 and thus distortion in the output of the transducer 180, in the sense that the transducer output will not be representative of the input signal Sin during the error period.

Some techniques to mitigate edge transition errors involve increasing the switching rate of the analog input buffer circuitry 130 so as to maintain a constant error period per PWM frame. However, such schemes increase switching losses, due to the increased switching frequencies involved.

A further issue that can arise is that for a zero transducer input signal (in which the signals $V_{AP}$, $V_{AN}$ are at the same level, e.g. VDD/2 or VDD), the output nodes 370, 380 are coupled to one of the reference voltage sources 320, 330 at the same time, leading to a "double kick" on that reference voltage source 320, 330. For example, for a zero transducer input signal in which $V_{AP}$, $V_{AN}$ are both at VDD/2, the output nodes 370, 380 are both coupled to the second reference voltage source 320 at the same time, leading to a "double kick" on the second reference voltage source 320 as both output nodes draw current from the second reference voltage source 320, which can result in intersymbol interference (ISI) distortion as the second reference voltage source 320 settles following this double kick.

There may be also a requirement that the second and third voltage reference sources 320, 330 are capable of driving a large amount of current, and that the second voltage reference source 320 is capable of sinking current as well as sourcing it.

In order to meet these requirements, the second and third voltage reference sources 320, 330 may be implemented as low dropout regulators (LDOs), for example. Each LDO requires an external capacitor 362, 364, and for modulation schemes with greater numbers of discrete signal levels, the number of external capacitors increases in proportion to the number of discrete signal levels. As will be appreciated, each external capacitor has an associated cost and occupies a defined area on a substrate such as a printed circuit board, and so it is desirable to minimise or at least reduce the number of capacitors required in the amplifier circuitry 100, whilst still reducing quiescent power consumption when the differential input signal to the transducer 180 is 0 v.

Figure 4:
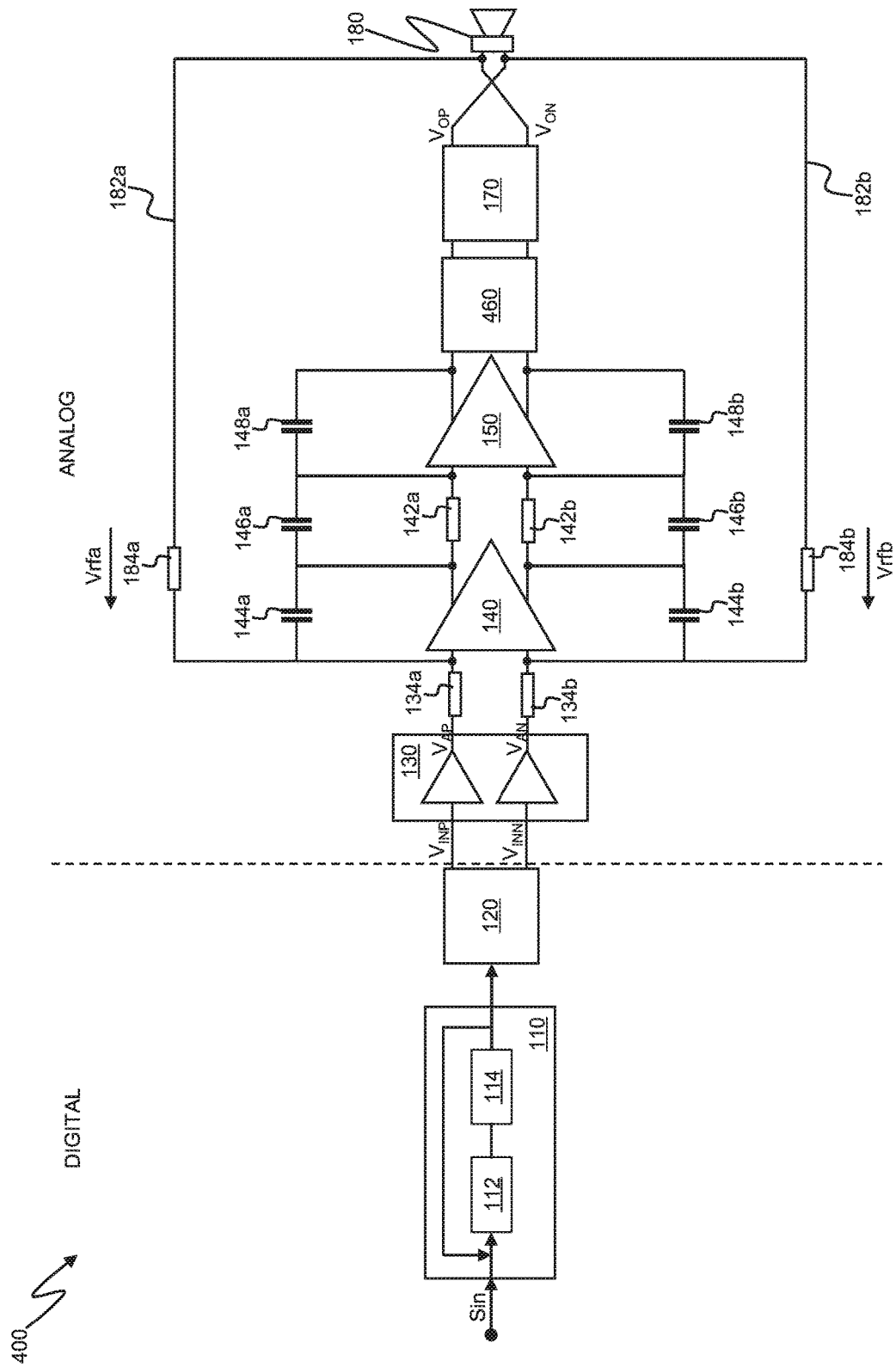
FIG. 4 is a schematic representation of example Class D audio amplifier circuitry according to the present disclosure.

FIG. 4 is a schematic representation of Class D amplifier circuitry according to the present disclosure. The Class D amplifier circuitry, shown generally at 400 in FIG. 4, includes a number of features in common with the Class D amplifier circuitry 100 of FIG. 1. Such common features are denoted by common reference numerals in FIGS. 1 and 4, and will not be described again here.

The circuitry 400 of FIG. 4 differs from the circuitry 100 of FIG. 1 in that it includes analog quantizer circuitry 460 which is configured to receive the differential signal pair output by the second differential amplifier circuitry 150 and to generate a BD3 modulated output signal pair comprising first and second three-level PWM output signals (as opposed to the two-level BD2 modulated signal pair output by the analog quantizer circuitry 160 in the example circuitry 100 of FIG. 1).

As in the circuitry 100 of FIG. 1, the digital PWM generator circuitry 120 is configured to receive the PWM modulated digital output signal from the PWM modulator circuitry 110 and to output a pair of BD2 modulated PWM output signals $V_{INP}$, $V_{INN}$ to the analog input buffer circuitry 130.

Thus the circuitry 400 implements a "hybrid" BD2-BD3 arrangement.

The voltage of the first analog output signal $V_{AP}$ generated and output by the analog input buffer circuitry 130 corresponds to the signal level of the first modulated PWM signal $V_{INP}$, and the voltage of the second analog output signal $V_{AN}$ generated and output by the analog input buffer circuitry 130 corresponds to the signal level of the second modulated PWM signal $V_{INN}$.

Thus, the first and second analog output signals $V_{AP}$, $V_{AN}$ generated by the analog input buffer circuitry 130 in the circuitry 400 can be at either a high analog voltage (e.g. +VDD) or a low analog voltage (e.g. 0 v), depending on the signal level of the received PWM signals $V_{INP}$, $V_{INN}$.

The analog quantizer circuitry 460 is configured to output a BD3 modulated output signal pair comprising first and second three-level PWM output signals, such that the driver output signals $V_{OP}$, $V_{ON}$ can each take one of three different voltages: high (e.g. +VDD), intermediate (e.g. VDD/2) or low (e.g. 0 v). Thus the analog quantizer circuitry 460 requires access to high, intermediate and low reference voltage supplies, and the high and intermediate reference voltage supplies require an external capacitor. However, because the analog quantizer circuitry 460 is within the feedback loop provided by the first and second output signal feedback paths 182a, 182b, the linearity requirements of these reference voltage supplies is reduced (in comparison to the linearity requirements of the open-loop reference voltage supplies of FIG. 3), because any error in the reference voltages can be compensated by the feedback loop. Thus, the implementation of the reference voltage supplies required by the analog quantizer circuitry 460 is less complex than the implementation of the reference voltage sources 320, 330 of FIG. 3.

Thus, in some examples the high and intermediate reference voltage supplies may be provided to the analog quantizer circuitry 460 by lower-complexity versions of the voltage reference sources 320, 330 of FIG. 3 (with the low reference voltage supply being provided by a ground or 0 v reference supply or rail).

In other examples, one or more of the high, intermediate and low voltage reference voltage supplies may be provided by one or more sources external to the circuitry 400. For example, a positive output terminal of a series combination of first and second batteries or cells could be coupled to the analog quantizer circuitry 460 to provide the high reference voltage supply, and a node between the first and second batteries or cells could be coupled to the analog quantizer circuitry 460 to provide the intermediate reference voltage supply, with the low reference voltage supply being provided by the negative terminal of the series combination of the batteries or cells or by a ground or 0 v reference supply or rail.

In order to supply a zero input to the transducer 180, the driver output signals $V_{OP}$, $V_{ON}$ must be equal, i.e. both $V_{OP}$, $V_{ON}$ must be at either the high voltage, the intermediate voltage or the low voltage. The first and second analog output signals $V_{AP}$, $V_{AN}$ generated by the analog input buffer circuitry 130 must also be equal, i.e. the first and second analog output signals must both be at either the high analog voltage level or the low analog voltage level, and because the analog output signals $V_{AP}$, $V_{AN}$ generated and output by the analog input buffer circuitry 130 are based on the digital PWM output signals $V_{INP}$, $V_{INN}$, then for a zero input to the transducer 180 the first and second digital PWM output signals $V_{INP}$, $V_{INN}$ must also be equal.

Thus, a zero input to the transducer 180 can be generated from six possible combinations of analog output signals $V_{AP}$, $V_{AN}$ and driver output signals $V_{OP}$, $V_{ON}$, as shown in Table 1 below.

In Table 1 it is assumed that the low signal level for the analog output signals $V_{AP}$, $V_{AN}$ and the driver output signals $V_{OP}$, $V_{ON}$ is 0 v, the high signal level for the analog output signals $V_{AP}$, $V_{AN}$ and the driver output signals $V_{OP}$, $V_{ON}$ is VDD, and the intermediate signal level for the driver output signals $V_{OP}$, $V_{ON}$ is VDD/2.

Table 1 also shows the power consumption associated with each possible transducer zero input combination, assuming that VDD=1.8 v, and Rf=Ri=1 kΩ.

TABLE 1

| $V_{ON}$ (=$V_{OP}$) | 0 | 0 | VDD/2 | VDD/2 | VDD | VDD |
|---|---|---|---|---|---|---|
| $V_{AN}$ (=$V_{AP}$) | 0 | VDD | 0 | VDD | 0 | VDD |
| $V_{ON} - V_{AN}$ (=$V_{OP} - V_{AN}$) | 0 | −VDD | VDD/2 | −VDD/2 | VDD | 0 |
| Power consumption (mW) | 0 | 1.62 | 0.405 | 0.405 | 1.62 | 0 |

As can be seen in Table 1, the six possible combinations of analog output signals $V_{AP}$, $V_{AN}$ and driver output signals $V_{OP}$, $V_{ON}$ are each associated with a different quiescent power consumption. Assuming that the circuitry 400 spends the same amount of time in each possible transducer zero input combination, the average power consumption for a zero transducer input state can be calculated as $$\frac{(0 + 1.62 + 0.405 + 0.405 + 1.62 + 0)}{6} = 0.68 \text{ mW}.$$

As will be appreciated, in a practical implementation the amount of time spent by the circuitry 400 in each possible transducer zero input combination may not be equal, as the circuitry 400 may be configured to favour the zero power consumption combinations (i.e. where $V_{ON}$, $V_{OP}$, $V_{AN}$ and $V_{AP}$ are all 0 or are all VDD) in order to reduce further the quiescent power consumption associated with the resistors 184a, 184b, 134a, 134b in zero transducer input states.

Nevertheless, as will be apparent from the foregoing discussion, the average quiescent power consumption of the hybrid BD2-BD3 arrangement of the circuitry 400 is significantly lower than the quiescent power consumption of the BD2-BD2 arrangement of the circuitry 100.

This reduction in quiescent power consumption can be achieved at a cost of only one more capacitor (for the intermediate reference voltage supply used by the analog quantizer circuitry 460) than is required by the BD2-BD2 arrangement of FIG. 1, and can be implemented with less complexity than the BD3-BD3 arrangement discussed above in the implementation of reference voltage supplies than the circuitry of FIG. 3.

It will be appreciated that the principles of the BD2-BD3 arrangement of FIG. 4 can be extended to an arrangement in which the digital PWM generator circuitry 120 outputs a pair of PWM modulated output signals having a first plurality (N) of discrete signal levels and the analog quantizer circuitry 460 outputs a pair of PWM modulated signals having a second plurality (M) of discrete signal levels (i.e. a BDN-BDM arrangement), where M is greater than N. Such an arrangement may provide reduced quiescent power consumption in comparison to a BDN-BDN arrangement, and reduced circuit complexity, cost and area, in comparison to a BDM-BDM arrangement.

Figure 5:
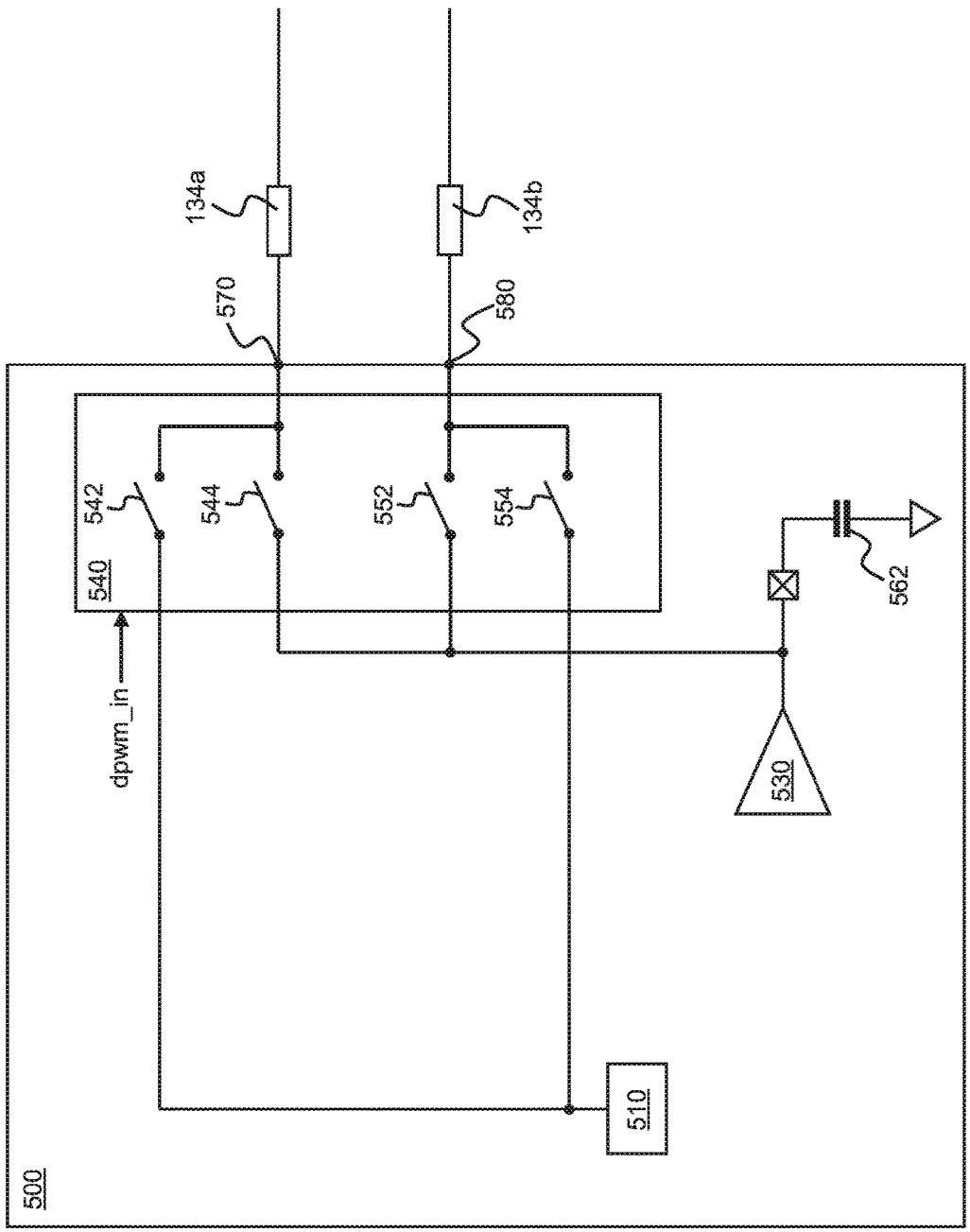
FIG. 5 is a schematic representation of analog input buffer circuitry for the circuitry of FIG. 2.

FIG. 5 is a schematic representation of an example implementation of analog input buffer circuitry for use in an implementation of the Class D amplifier circuitry 400 in which the digital PWM generator circuitry 120 uses a BD2 modulation scheme.

In contrast to the analog input buffer circuitry 300 of FIG. 3, the analog input buffer circuitry 500 comprises only two reference voltage sources: a first reference voltage source 510, which supplies a first, low, voltage reference (e.g. 0 v); and a second reference voltage source 530, which supplies a second, high voltage reference (e.g. VDD, which may be 1.8 v, for example).

Outputs of the first and second reference voltage sources 510, 530 are coupled to a switch network 540. The output of the second reference voltage source 530 is also coupled to a first terminal of a capacitor 562, whose second terminal is coupled to ground. The capacitors 562 may have a capacitance of the order of 1 μF. Where the amplifier circuitry 400 or the analog input buffer circuitry 500 is implemented as an integrated circuit (chip), the capacitor 562 may be provided externally of the integrated circuit (i.e. off-chip) and coupled to the reference voltage sources via an IC contact such as a pad, ball, pin or the like.

The switch network 540 includes first and second high-side switches 542, 544 and first and second low-side switches 552, 554. The high side switches 542, 544 are operable to selectively couple one of the first or second reference voltage sources 510, 520 to a first output node 570 of the buffer circuitry 500, which is coupled to the first resistor 134a. Similarly, the low-side switches 552, 554 are operable to selectively couple one of the first or second reference voltage sources 510, 520 to a second output node 580 of the buffer circuitry 500, which is coupled to the second resistor 134b. The switch network 540 receives a control signal dpwm_in, which is indicative of the signal levels of the modulated PWM output signals $V_{INP}$, $V_{INN}$, and controls the switches 542-554 to generate a desired differential output signal pair for input to the first differential amplifier circuitry 140.

As will be apparent from FIG. 5, the analog input buffer circuitry 500 includes only one capacitor 562, in contrast to the analog input buffer circuitry 300 of FIG. 3, which requires two capacitors 362, 364. Thus, the cost and circuit area of the analog input buffer circuitry 500 are reduced in comparison with those of the analog input buffer circuitry 300.

In some examples, the first and second reference voltage sources 510, 530 may also be used, respectively, as the low and high reference voltage supplies for the analog quantizer circuitry 460, with an additional voltage source that is external to the circuitry 400, 550 (e.g. a battery or cell) being used to provide the intermediate reference voltage supply to the analog quantizer circuitry 460.

Figure 6:
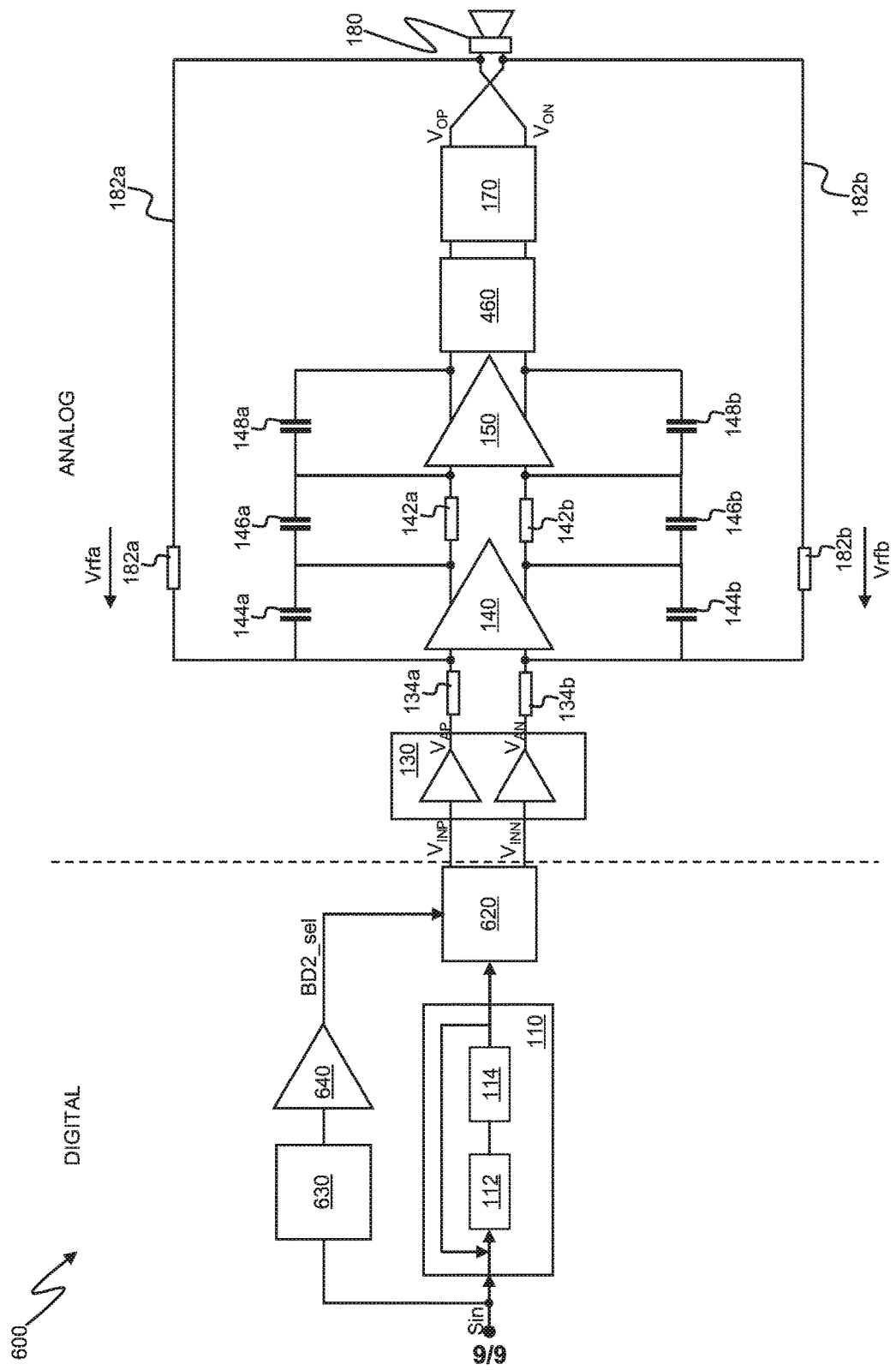
FIG. 6 is a schematic representation of further example Class D audio amplifier circuitry according to the present disclosure.

FIG. 6 is a schematic representation of alternative Class D amplifier circuitry according to the present disclosure. The Class D amplifier circuitry, shown generally at 600 in FIG. 6, includes a number of features in common with the Class D amplifier circuitry 400 of FIG. 4. Such common features are denoted by common reference numerals in FIGS. 4 and 6, and will not be described again here.

The circuitry 600 of FIG. 6 differs from the circuitry 400 of FIG. 4 in that it includes digital PWM generator circuitry 620 configured to receive the PWM modulated digital output signal from the PWM modulator circuitry 110 and to output a pair of modulated PWM output signals $V_{INP}$, $V_{INN}$ to the analog input buffer circuitry 130. The PWM output signals $V_{INP}$, $V_{INN}$ may be modulated according to a BD2 modulation scheme or a BD3 modulation, and the digital PWM generator circuitry 620 is configured to receive a control signal BD2_sel to select between BD2 and BD3 modulation.

The circuitry 600 further includes envelope detector circuitry 630 and comparator circuitry 640.

The envelope detector circuitry 630 is configured to detect an envelope of the received input signal Sin, and to output a signal indicative of a signal level of the received input signal Sin to the comparator circuitry 640.

The comparator circuitry 640 is configured to compare the signal indicative of the received signal level to a threshold and, based on the comparison, to assert or de-assert the control signal BD2_sel. For small input signals (i.e. where the signal indicative of the signal level of the received input signal is below the threshold), the control signal BD2_sel is deasserted, such that the digital PWM generator circuitry 620 generates the first and second PWM modulated signals $V_{INP}$, $V_{INP}$ according to a BD3 modulation scheme. For larger input signals (i.e. where the signal indicative of the signal level of the received input signal meets or exceeds the threshold), the control signal BD2_sel is asserted, such that the digital PWM generator 620 generates the first and second PWM modulated signals $V_{INP}$, $V_{INP}$ according to a BD2 modulation scheme.

As in the circuitry 400, the circuitry 600 includes analog quantizer circuitry 460 which is configured to receive the differential signal pair output by the second differential amplifier circuitry 150 and to generate a BD3 modulated output signal pair comprising first and second three-level PWM output signals.

Thus, the circuitry 600 is selectively operable in either a BD2-BD3 mode or in a BD3-BD3 mode, depending upon the signal level of the received input signal Sin. At low input signal levels, where the quiescent power consumption might otherwise constitute a significant proportion of the total power consumption of the circuitry 600, the circuitry 600 operates in its BD3-BD3 mode to minimise the quiescent power consumption, and thus reduce total power consumption, whereas at higher input signal levels at which the quiescent power consumption may constitute a less significant proportion of the total power consumption, the circuitry 600 operates in its BD2-BD3 mode.

In order to operate in a BD3-BD3 mode, the analog input buffer circuitry 130 requires access to three reference voltage supplies, for the high, intermediate and low voltage levels that can be taken by the first and second buffered analog output signals $V_{AP}$, $V_{AN}$. However, because the BD3-BD3 mode is only used when the input signal Sin is small, the intermediate reference voltage supply can be less complex and smaller than the intermediate reference voltage supply used in the analog input buffer circuitry 300 of FIG. 3, and does not require a capacitor, because the linearity requirements of the intermediate reference voltage supply are greatly relaxed and because ISI is less of a problem at lower signal levels than at high signal levels. Thus, the circuitry 600 requires fewer capacitors and less complex reference voltage supply circuitry for the analog input buffer circuitry 130 than the fixed BD3-BD3 arrangement described above with reference to FIGS. 1 and 3.

In operation of the circuitry 600 in its BD3-BD3 mode, quiescent power consumption at zero transducer input signal states is eliminated (or at least reduced or minimised), because for each zero transducer input signal state, $V_{ON}$ can be made to be equal to $V_{AP}$ as described above, such that no voltage develops across the series combination of the first feedback resistor 184a and the first resistor 134a. Similarly, $V_{OP}$ can be made to be equal to $V_{AN}$, such that no voltage develops across the series combination of the second feedback resistor 184b and the second resistor 134b.

In operation of the circuitry 600 in its BD2-BD3 mode, quiescent power consumption at zero transducer input signal states is reduced in comparison to the quiescent power consumption of the BD2-BD2 arrangement described above with reference to FIG. 1.

Thus, the selectable BD2/3-BD3 arrangement of the circuitry 600 of FIG. 6 provides similar benefits in terms of reduced quiescent power consumption, circuit cost, area and complexity as the fixed BD2-BD3 arrangement of FIG. 4 and the fixed BD3-BD3 arrangement described above with reference to FIG. 1.

It will be appreciated that the circuitry 600 requires additional envelope detector circuitry 630 and comparator circuitry 640. However, in many applications the envelope detector circuitry 630 and comparator circuitry 640 will be present, e.g. for purposes of dynamic range extension or the like, and thus in such applications the existing envelope detector and comparator circuitry can be re-used for the selectable BD2/3-BD3 arrangement of the circuitry 600. Additionally, because the envelope detector circuitry 630 and comparator circuitry 640 are implemented using digital circuitry, the circuit area and power consumed by the envelope detector circuitry 630 and comparator circuitry 640 are relatively small.

It will be appreciated that the principles of the selectable BD2/3-BD3 arrangement of FIG. 6 can be extended to an arrangement in which the digital PWM generator circuitry 120 selectively outputs a pair of PWM modulated output signals having a first plurality (N) or a second plurality (M) of discrete signal levels (where M is greater than N, and where the first plurality N or the second plurality M is selected on the basis of an input signal level, for example), and the analog quantizer circuitry 460 outputs a pair of PWM modulated signals having the second plurality M of discrete signal levels (i.e. a BDN/M-BDM arrangement).

The Class D amplifier circuitry described above with reference to the accompanying drawings may be incorporated in a host device such as a laptop, notebook, netbook or tablet computer, a gaming device such as a games console or a controller for a games console, a virtual reality (VR) or augmented reality (AR) device, a mobile telephone, a portable audio player or some other portable device, or may be incorporated in an accessory device for use with a laptop, notebook, netbook or tablet computer, a gaming device, a VR or AR device, a mobile telephone, a portable audio player or other portable device.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Class D amplifier circuitry comprising:
   input buffer circuitry configured to receive a first digital input signal modulated according to a first modulation scheme in which the digital input signal can take a first plurality N of discrete signal levels;
   analog modulator circuitry configured to generate an analog modulated signal based on an analog output signal output by the input buffer circuitry; and
   quantizer circuitry configured to generate an output signal based on the analog modulated signal, wherein the output signal is modulated according to a second modulation scheme in which the output signal can take a second plurality M of discrete signal levels,
   wherein the second plurality M is greater than the first plurality N.

2. Class D amplifier circuitry according to claim 1, further comprising digital signal generator circuitry configured to generate the first digital input signal.

3. Class D amplifier circuitry according to claim 2, further comprising digital modulator circuitry configured to generate a modulated digital signal based on a digital input signal.

4. Class D amplifier circuitry according to claim 2, wherein the digital signal generator circuitry is configured to selectively generate the first digital input signal according to the first modulation scheme or a second digital input signal according to the second modulation scheme.

5. Class D amplifier circuitry according to claim 4, further comprising:
   digital modulator circuitry configured to generate a modulated digital signal based on a digital input signal; and
   envelope detector circuitry configured to output a signal indicative of a signal level of the digital input signal,
   wherein the digital signal generator circuitry is configured to generate the first digital input signal according to the first modulation scheme or the second digital input signal according to the second modulation scheme based on the signal level of the digital input signal.

6. Class D amplifier circuitry according to claim 5, wherein the digital signal generator is configured to generate the first digital input signal according to the first modulation scheme if the input signal level meets or exceeds a threshold, and to generate the second digital input signal according to the second modulation scheme if the input signal level is below the threshold.

7. Class D amplifier circuitry according to claim 1, wherein the input buffer circuitry comprises first and second reference voltage sources and a switch network operable to selectively couple the first or second reference voltage source to an output node of the input buffer circuitry based on a control signal indicative of a signal level of the first digital input signal.

8. Class D amplifier circuitry according to claim 4, wherein the input buffer circuitry comprises first, second and third reference voltage sources and a switch network operable to selectively couple the first, second or third reference voltage source to an output node of the input buffer circuitry based on a control signal indicative of a signal level of the second digital input signal generated.

9. Class D amplifier circuitry according to claim 1, wherein the first plurality N is equal to 2.

10. Class D amplifier circuitry according to claim 1, wherein the second plurality M is equal to 3.

11. Class D amplifier circuitry according to claim 3, wherein the analog input signal comprises an audio signal.

12. Class D amplifier circuitry according to claim 1, wherein the digital input signal, the analog modulated signal and the output signal each comprise a differential signal pair.

13. Class D amplifier circuitry according to claim 1, wherein the digital input signal comprises a pulse width modulated (PWM) digital signal.

14. Class D amplifier circuitry according to claim 1, wherein the analog modulated signal comprises a pulse width modulated (PWM) analog signal.

15. A host device comprising Class D amplifier circuitry according to claim 1.

16. A host device according to claim 15, wherein the host device comprises a laptop, notebook, netbook or tablet computer, a mobile telephone, a portable device, or an accessory device for use with a laptop, notebook, netbook or tablet computer, a mobile telephone, or a portable device.

17. Class D amplifier circuitry comprising:
an input buffer for receiving a digital PWM input signal and outputting an analog output signal based on the digital PWM input signal;
an analog modulator for generating an amplified PWM signal based on the digital PWM input signal; and
an analog quantizer for generating a multi-level PWM output signal for driving a transducer based on the amplified PWM signal,
wherein the multi-level output signal has a greater number of discrete signal levels than the digital PWM input signal.

18. Class D amplifier circuitry comprising:
an input buffer for receiving a digital PWM input signal and outputting an analog output signal based on the digital PWM input signal;
an analog modulator for generating an amplified PWM signal based on the digital PWM input signal; and
an analog quantizer for generating a multi-level PWM output signal for driving a transducer based on the amplified PWM signal,
wherein a number of discrete signal levels in the digital PWM input signal is variable based on a level of an input signal received by the Class D amplifier circuitry, and wherein the number of discrete signal levels in the digital PWM input signal is equal to or less than a number of discrete signal levels in the multi-level PWM output signal.

* * * * *